US006542373B1

(12) United States Patent
Oba

(10) Patent No.: US 6,542,373 B1
(45) Date of Patent: Apr. 1, 2003

(54) MEMORY MODULE DEVICE FORMATION AND MOUNTING METHODS THEREOF

(75) Inventor: Ryo Oba, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/185,269

(22) Filed: Nov. 3, 1998

(30) Foreign Application Priority Data

| Nov. 4, 1997 | (JP) | ................................. 9-302194 |
| Oct. 29, 1998 | (JP) | ............................. 10-309030 |

(51) Int. Cl.$^7$ .............................. H05K 1/14; H05K 7/02
(52) U.S. Cl. ...................... 361/760; 361/777; 361/778; 361/784; 361/803; 361/735; 174/261
(58) Field of Search ................................. 361/728, 729, 361/735, 760, 761, 784, 790, 803, 810, 748, 777, 778, 783; 439/74; 174/255, 261, 262

(56) References Cited

U.S. PATENT DOCUMENTS

| 5,130,894 A | * | 7/1992 | Miller .......................... 361/686 |
| 5,172,303 A | * | 12/1992 | Bernardoni et al. ......... 361/760 |
| 5,176,526 A | * | 1/1993 | Hillbish et al. ............. 439/108 |
| 5,311,401 A | * | 5/1994 | Gates et al. ................. 174/255 |
| 5,334,875 A | * | 8/1994 | Sugano et al. .............. 257/686 |
| 5,337,218 A | * | 8/1994 | Cipolla et al. .............. 361/785 |
| 5,420,751 A | * | 5/1995 | Burns .......................... 361/707 |
| 5,434,745 A | * | 7/1995 | Shokrgozar et al. ........ 361/735 |
| 5,544,017 A | * | 8/1996 | Beilin et al. ................. 361/790 |
| 5,575,686 A | * | 11/1996 | Noschese ..................... 439/620 |
| 5,585,675 A | * | 12/1996 | Knopf .......................... 257/686 |
| 5,707,242 A | * | 1/1998 | Mitra et al. ................... 439/74 |
| 5,721,671 A | * | 2/1998 | Ruque ......................... 361/796 |
| 5,825,630 A | * | 10/1998 | Taylor et al. ................ 361/790 |
| 5,956,233 A | * | 9/1999 | Yew et al. ................... 361/760 |
| 5,963,953 A | * | 10/1999 | Purdom et al. ............. 361/790 |
| 6,109,929 A | * | 8/2000 | Jasper .......................... 439/74 |

* cited by examiner

Primary Examiner—Jayprakash N. Gandhi
(74) Attorney, Agent, or Firm—Konrad Raynes Victor & Mann, LLP; Alan S. Raynes

(57) ABSTRACT

In a memory module arranged with the connection terminals located on both sides of the circuit board, the connection terminals for transmitting a common signal to all memory modules conducts with the connection terminals that are directly facing each other on the opposite sides of the circuit board, and the connection terminals for transmitting an intrinsic signal to the respective memory modules conduct with connection terminals that are not directly facing each other through the circuit board.

24 Claims, 13 Drawing Sheets

2: CIRCUIT BOARD
3: MEMORY CHIP
4: CONTACT TERMINAL

MEMORY MODULE DEVICE FORMATION AND MOUNTING METHODS THEREOF

TECHNICAL FIELD

The present invention relates to memory module devices including their formation and use in other devices such as memory cards and computers.

RELATED ART

Conventionally, in a memory module 101 that is used for a memory card and a computer and the like, one or more memory chips 103 are mounted on a surface of a circuit board 102. FIG. 11 is a perspective view showing an aspect of a conventional memory module 1. As shown in the figure, at an edge of one side in the longitudinal direction of the circuit board 162, contact terminals 104 that have been conducted with (the respective terminals of) the mounted memory chips 103 are arranged. Further, the contact terminals 104 are provided on both sides of the circuit board 102 such that they are facing each other through the circuit board 102 (a back side thereof is not shown), and the contact terminals 104 that are facing each other through the circuit board 102 are designed to conduct. Further, the electrical connection of the contact terminals 104 that are facing each other through the circuit board 102 is implemented by a through-hole (not shown) provided in the circuit board 102.

Then, the above-described memory module 101 is installed in a connector 106 provided in a main board 105 that constitutes a memory card and a computer. FIG. 12 is a side view showing a state of which the memory module 101 is installed in the connector 106. As shown in the figure, on a surface of the main board 105 a plurality of connectors 106 are provided, and by individually attaching the memory modules 101 to the connectors 106, it makes it possible to pass a signal from the main board 105 side to the individual memory modules 101.

In the conventional memory module 101, if the number of attachments of the memory modules 101 is intended to be increased for a purpose of increasing the memory capacity, then the number of connectors 106 must be increased, thereby the mounting area increases, and as a consequence, there is a problem that it is difficult to achieve miniaturization of the memory card and the computer itself.

SUMMARY

It is an object of embodiments of the present invention to provide a memory module structure which minimizes the need for a large mounting area in a device while maintaining a general memory module versatility.

It is another object of embodiments of the present invention to provide a body of memory modules for installation into a memory card and/or a computer.

It is yet another object of embodiments of the present invention to provide a stack including a multiple number of the identical memory modules, in which a necessary signal can be connected to all memory modules in a simple structure.

These and other objects may be accomplished in certain embodiments by providing a memory module including a circuit board on which a memory chip is mounted and a plurality of connection terminals which are provided at locations on both sides of the circuit board for passing a signal with the memory chip through the connection terminals. The connection terminals include a first connection terminal group for passing a specific signal in the memory chip, and a second connection terminal group for passing other signals. The connection terminals of the first connection terminal group are configured such that connection terminals on both sides of the circuit board at asymmetrical locations are electrically connected. The connection terminals of the second connection terminal group are configured such that connection terminals on both sides of said circuit board at symmetrical locations are electrically connected.

Other embodiments include a laminated body of memory modules comprising memory chips and connection terminals for passing one or more signals between a memory chip and a device body, where the connection terminals include a first group of connection terminals for passing a specific signal to a specific memory chip. The first group of connection terminals are facing one another from overlapping memory modules and are electrically connected to each other. The connection terminals also include a second group of connection terminals for passing other signals to the memory chips as common signal lines. The second group of connection terminals are facing one another from overlapping memory modules and are electrically connected to each other, and the common signal lines are connected to the device body.

Embodiments also include a laminated body of memory modules comprising memory chips and connection terminals in which the laminated body is coupled to a device body. The connection terminals include first connection terminals for passing a specific signal to a specific memory module chip. The first connection terminals are individually connected to the device body from a specific memory module. The connection terminals also include second connection terminals that are facing one another from overlapping memory modules in the laminated body. The second connection terminals facing each other are electrically connected to each other as a common signal line, and the common signal line is connected to the device body.

Embodiments also include a memory device comprising a first memory module including a circuit board having top and bottom surfaces and at least one memory chip on at least one of the top and bottom surfaces. The circuit board also includes a plurality of top surface connection terminals disposed on the top surface and a plurality of bottom surface connection terminals disposed on the bottom surface. A first group of the plurality of connection terminals includes first group top surface connection terminals in electrical contact with and located directly above first group bottom surface connection terminals. A second group of said plurality of connection terminals includes second group top surface connection terminals in electrical contact with second group bottom surface connection terminals that are not directly below the top surface connection terminals.

Still other embodiments relate to a memory card, including one or more memory modules having a structure according to the memory modules discussed above. Embodiments also relate to a computer including one or more memory modules such as those described above.

Yet other embodiments relate to methods for forming a memory device. One such method includes providing a plurality of memory modules having top and bottom surfaces and top and bottom connection terminals. Each memory module includes a first connection terminal group including first top surface connection terminals in electrical contact with and located directly above first bottom surface connection terminals. Each memory module also includes a second connection terminal group including second top surface connection terminals in electrical contact with second bottom surface connection terminals that are not directly below the second top surface connection terminals. At least two of the memory modules are stacked so that the top connection terminals from a first memory module are directly aligned with and electrically coupled to the bottom connection terminals of a second memory module.

DESCRIPTION OF THE DRAWINGS

Embodiments of the invention are described with reference to the accompanying drawings which, for illustrative purposes, are schematic and not drawn to scale.

DESCRIPTION OF EMBODIMENTS

Figure 13:
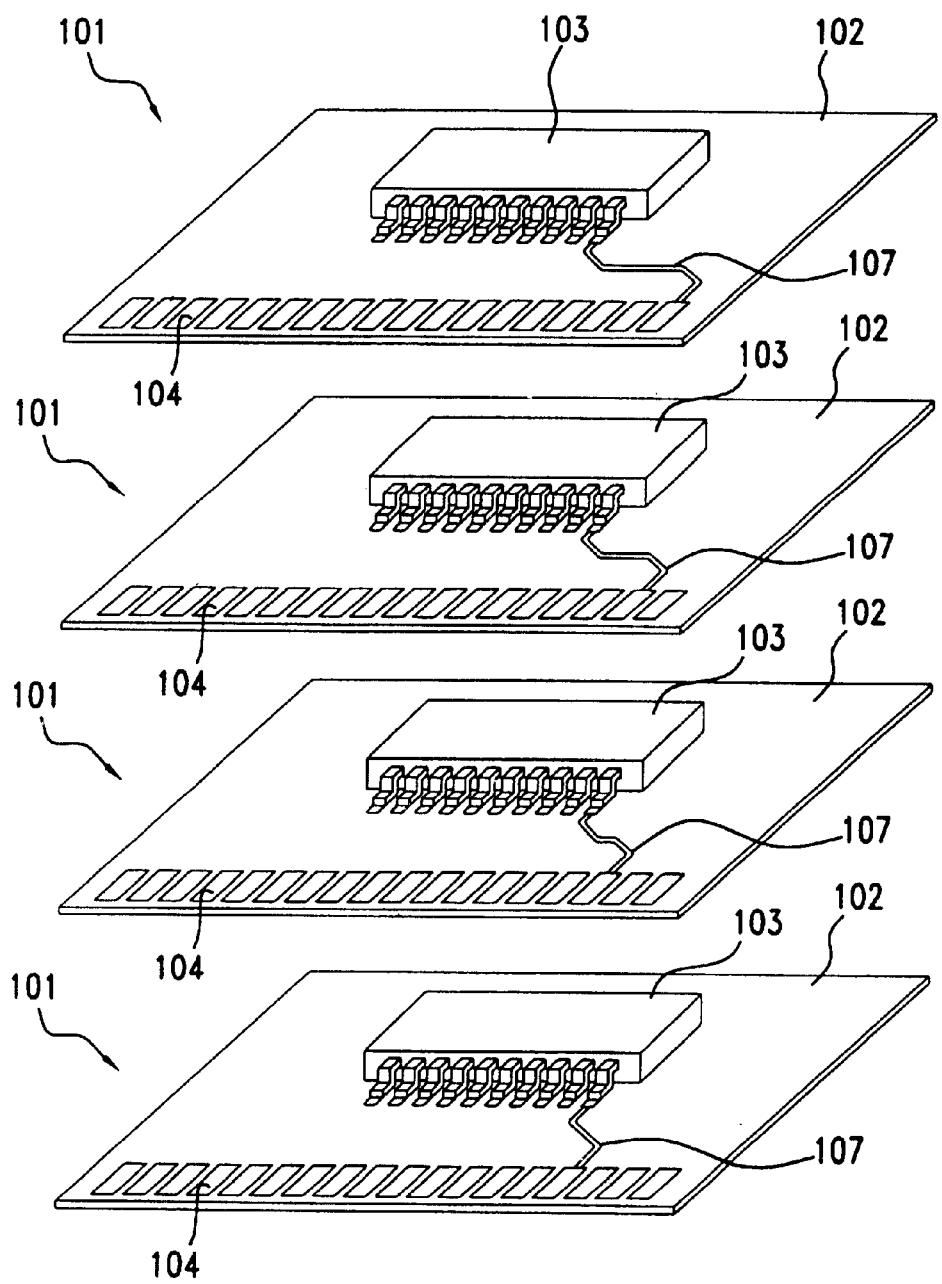
FIG. 13 is a perspective view showing an attachment method for connecting memory modules to one another.

When attaching a multiple number of the memory modules to a device body, the connection terminal can often not be shared because there are intrinsic signals to the respective memory modules, and by increasing the number of memory modules that can be attached, the number of the connection terminals of the device body is increased, thereby the connection method becomes more complex. In order to solve this problem, a memory module 101 shown in FIG. 13 could be utilized. That is, according to the memory module 101 as shown in the figure, a wiring 107 on the circuit board 102 is changed for each memory module 101 to contact different contact terminals 104 in each memory module 101. Attaching such memory module 101 to the connector in a stack of memory modules of which the contact terminals 104 with the identical number are connected each other, then with a mounting area of one connector, multiple memory modules 101 can be attached. However, in the above described method, a different memory module 101 must be used for each device body, thereby a problem occurs in that the general versatility of the memory module 101 is decreased because different modules must be utilized. Certain preferred embodiments of the present invention utilize a more versatile memory module structure as described below.

A memory module according to a first embodiment includes a memory module comprising a circuit board on which a memory chip is mounted, a plurality of connection terminals which are respectively provided at symmetrical locations on both sides of the circuit board and are for passing a signal with the memory chip through the connection terminals. The memory module is characterized in that the connection terminals have both a first connection terminal group for passing a specific signal in the memory chip, and a second connection terminal group for passing other signals. The connection terminals of the first connection terminal group are configured such that the connection terminals at asymmetrical locations on both sides are electrically conducted therewith, and the connection terminals of the second connection terminal group are configured such that the connection terminals at symmetrical locations on both sides are electrically conducted therewith.

According to the memory module described above, in the first connection terminal group, contacting the connection terminals facing each other by superimposing the memory modules each other, since a front side and a back side in the circuit board are conducted in the asymmetrical locations, so that by sending a signal to an edge side of the laminated memory modules, i.e., to a connection terminal of a memory module either at the top level or at the bottom level, the signal propagates to a laminated direction of the memory modules, the signal can be transmitted to an arbitrary memory module. Since the memory module of the present invention possesses a configuration as described above, at a time when an allocation of a signal to a connection terminal is attached by piling up a multiple number of the identical memory modules, a necessary signal can be connected to all memory modules in a simple structure. Further, the specific signal indicates, more concretely, a signal such as a chip enable (also called as "chip select"), and in other words, conceptually, it indicates a signal having a function that to which memory IC or to which memory module the body device selects for accessing.

A laminated body of memory modules according to another embodiment includes a laminated body of memory modules for superimposing memory modules according to the first embodiment described above. For passing a signal to the memory modules, the laminated body is characterized in that the connection terminals that are electrically conducted with the memory chip and placed at the facing locations on adjacent memory modules are electrically conducted with each other. By sending a signal to the first connection group of connection terminals of the memory modules at the top level or at the bottom level, it makes possible to send the signal to an arbitrary memory module within the laminated stack of memory modules. Further, other signals can be transmitted to all laminated memory modules by sending a signal to the second connection group of connection terminals at the top level or at the bottom level.

A laminated body of memory modules according to another embodiment is characterized in that a laminated body of memory modules as described above is mounted on a device body. By using a laminated body of memory modules, it is not necessary to separately mount each memory module individually to the device body, thereby making it possible to collectively mount the memory modules.

A laminated body of memory modules according another embodiment is characterized in that a connector for use in attaching said memory module is mounted thereon. The use of the connector with the laminated body of the memory modules enables attaching/detaching the laminated body of the memory modules from the device body to be facilitated.

A laminated body of memory modules according to another embodiment is characterized in that an anisotropic conduction adhesive member is placed between the connection terminals from overlapping memory modules that are facing one another. The use of the adhesive member makes it possible to conduct between memory modules without providing the connector between the laminated memory modules. As a result, it is possible to make the thickness of the memory modules in the laminated direction much thinner as well as to make it in correspondence with a narrower pitch.

A laminated body of memory modules according to another embodiment includes a body of memory modules superimposed over one another, and sandwiched with connectors, and is characterized in that one of the parts for use in fitting the memory modules together is provided with the connector, and another one of the parts for use in fitting the memory modules together is provided with the memory module circuit board. The connection terminals that are facing one another from overlapping memory modules are electrically coupled with each other by fitting the one of the parts provided with the connector to the one of the parts provided with the circuit board. By fitting the parts provided with the circuit board and with the connectors, proper alignment of the connector and the modules laminated in the connector can be maintained. Then, by sending a signal to the connection terminals of the memory modules facing the connector, the signal can be moved along a laminated direction of the memory modules. Accordingly, by sending a signal to an arbitrary connection terminal of the memory modules facing to the connector, the signal can be transmitted to a memory module at an arbitrary number of the order.

A laminated body of memory modules according to another embodiment includes a circuit board that is configured with a flexible board, and the electrical coupling of the connection terminals to each other is made possible by sandwiching the connectors. Since the flexible board has a flexibility against an external force, by applying a force to a laminated direction of the memory modules in the connector, the flexible board will be bent by the force, thereby the connection terminals provided in the flexible board will be tightly contacted with each other. According to the flexibility of the board, the connection terminals will be tightly contacted even with a small sandwiching force of the connector, thereby making it possible to enhance the reliability of the electrical contacts between memory modules.

A laminated body of memory modules according to another embodiment includes a laminated body of memory modules in which a passing of a signal with a memory chip in the laminated body is made through connection terminals into a device body. The connection terminals that are facing each other in adjacent overlapping memory modules for passing a specific signal to a memory chip are connected to each other, and connection terminals that are facing each other in adjacent overlapping memory modules for passing of other signals are also connected to each other to make these as a common signal line, and the common signal line is connected to the device body. This structure permits selection of the respective memory modules that are laminated, and a transmission/reception of data and the like to the selected memory module to be made from the device body through the common signal line. Further, since only the common signal line is connected to the device body, it is possible to reduce the mounting area for the device body.

A laminated body of memory modules according to another embodiment includes a laminated body of memory modules for installing a plurality of memory modules on which memory chips are mounted, and is characterized in that the connection terminals for passing a specific signal to a memory chip are individually connected to a device body. The connection terminals that are facing each other in adjacent overlapping memory modules in the laminated body for passing other signals are connected to each other, making these a common signal line, and the common signal line is also connected to the device body. Since the connection terminals for passing other signals are connected each other, and these are made to be a common signal line, the connection with the device body may be made by the common signal line only. As a result, this makes it possible to reduce the mounting area for the device body.

Another embodiment includes a memory card comprising a memory module as described in the first embodiment above. The mounting area of the memory module can be reduced, so that miniaturization of the memory card itself can achieved, and multiple memory modules can be efficiently incorporated into the card.

Another embodiment includes a computer comprising a memory module as described in the first embodiment above. The mounting area for memory modules within the computer can be reduced, enabling miniaturization of the computer itself, and multiple memory modules can be efficiently incorporated into the computer.

Certain preferred embodiments of the present invention, including a memory module and the installation structure for attaching the memory module to a device, as well as a memory card and a computer comprising the memory module, will be described below with reference to the drawings.

Figure 1A:
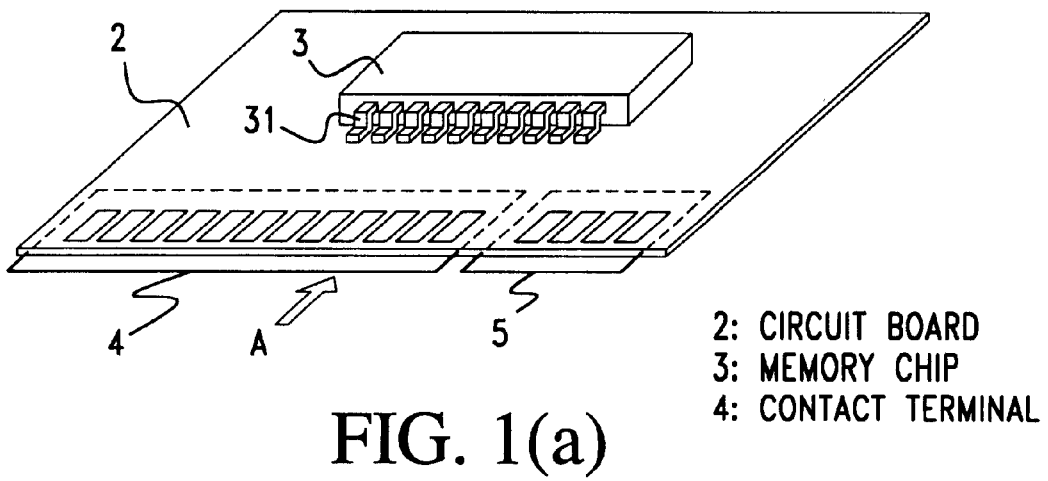
FIG. 1(a) is perspective view and FIG. 1(b) is a front view showing a memory module according to an embodiment of the present invention.

FIGS. 1(*a*), (*b*) illustrate a memory module according to an embodiment of the present invention. In FIG. 1(*a*), 2 denotes a circuit board, 3 denotes a memory, which may be mounted on the circuit board 2 by soldering and the like. Connection terminal group 4 may be a group of connection terminals for transmitting a common signal to all memory modules in a stack of memory modules. Connection terminal group 5 may be a group of connection terminals for transmitting a fixed (intrinsic) signal to the respective memory modules in a stack of memory modules. The connection terminal groups 4, 5 that have been conducted (electrically coupled) with the connection terminal group 31 may be formed at one end of the circuit board 2, thereby enabling to give and receive the data to and from the outside.

FIG. 1(*b*) is a front view of the memory module from the direction A indicated in FIG. 1(*a*). The connection terminal group 41, 51 are formed on one side of the circuit board 2, and the connection terminal group 42, 52 are formed on the opposite side approximately aligned with and in symmetry with the connection terminal groups 41, 51. Herein, the connection terminal group 41 and 42 are in electrical contact with the connection terminals that are facing each other with a through-hole within the circuit board. That is, the connection terminal 41a is in electrical contact with the connection terminal 42a, the connection terminal 41b is in electrical contact with the connection terminal 42b, and the connection terminal 41c is in electrical contact with the connection terminal 42c. These connection terminal groups 41, 42 are electrically connected to the connection terminals, such as an address line and a data line and the like among the connection terminal group 31 of the memory 3, for transmitting a signal that is shared with all memory modules.

On the other hand, the connection terminal group 51 and 52 are such that the connection terminals that are facing each other through the circuit board are not in electrical contact with each other, but are in electrical contact with the connection terminals adjacent to the connection terminals that are facing each other with a throughhole. That is, the connection terminal 51b is in electrical contact with the connection terminal 52b, the connection terminal 51c is in electrical contact with the connection terminal 52c, and the connection terminal 51d is in electrical contact with the connection terminal 52d, respectively. Further, the connection terminal 51a is connected to the connection terminal for transmitting a signal, such as an enable signal among the connection terminal group 31 of the memory 3 that is intrinsic to the respective memory modules.

Figure 1B:
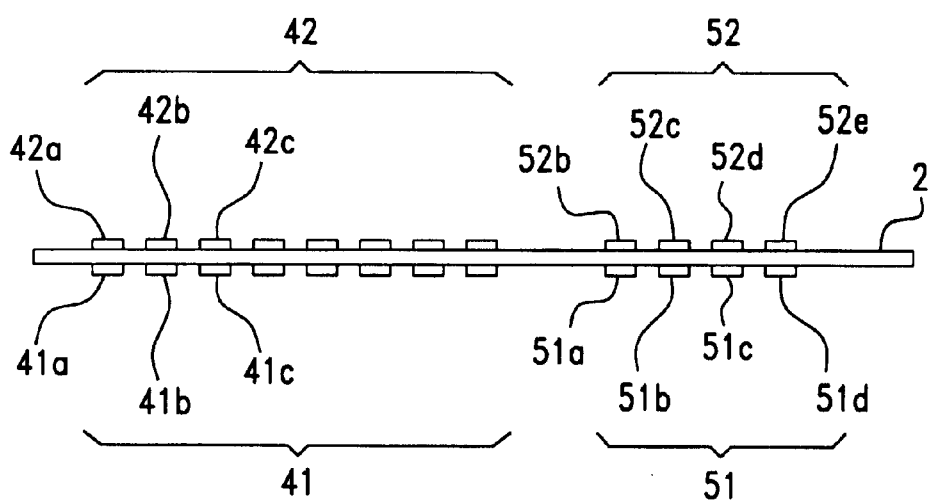
Figure 2:
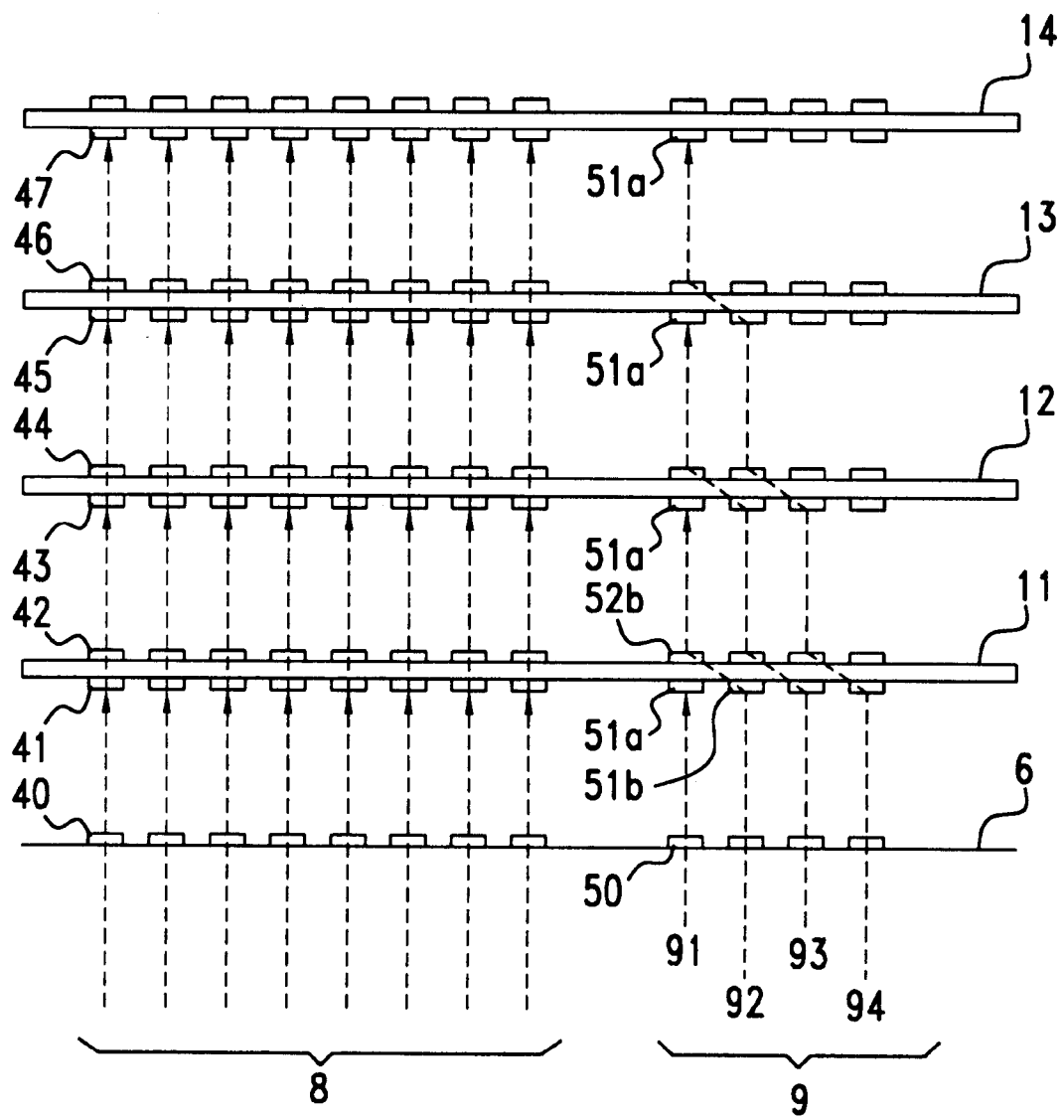
FIG. 2 is an illustrative view showing a transmission path of a signal in a memory module according to an embodiment of the present invention.

FIG. 2 is an illustrative view showing a state in which the memory modules configured as described above may be multiple-attached to the device body. Herein 6 denotes a device body, and is provided with the connection terminal group 40, 50 for connecting to the respective memory modules. Further, the device body 6 may include a main board and a memory card and computer and the like into which the main board is installed. The connection terminal group 40 is the connection terminal group for transmitting the signal groups 8 that are common among all of the memory modules, such as an address line and a data line and the like, and the connection group 50 is the connection terminal group for transmitting the signal groups 9 that are fixed (intrinsic) to the respective memory modules, such as an enable signal and the like. Memory modules 11, 12, 13 and 14 all have the same terminal arrangements as the memory module shown in FIG. 1(b), and the device body 6 and the respective memory modules may be connected through a connector such as, for example, a zebra-connector that conducts with the facing connection terminals. As a result, the signal groups 8 that are common among all of the memory modules are electrically connected from the connection terminal 40 of the device body 6 to the facing connection terminal 41 of the memory module 11, and since the connection terminal 41 is in electrical contact with the connection terminal 42 that is on the opposite side as facing thereto, thus it is connected to the connection terminal 43 of the memory module 12. Hereinafter, these processes are repeated, and the same signals are straightforwardly propagated to the memory modules 13, 14.

On the other hand, among the signal group 9 that is intrinsic to the respective memory modules, a signal 91 is connected to the connection terminal 51a of the memory module 11 that is faced. Also, a signal 92 is connected to the connection terminal 51b of the memory module 11 that is faced, and since the connection terminal 51b conducts with the connection terminal 52b on the opposite side, thereby connecting to the connection terminal 51a of the memory module 12 that is faced to 52b. Similarly, the signal 93 is connected to the connection terminal 51a of the memory module 13, and the signal 94 is connected to the connection terminal 51a of the memory module 14. That is, since the signal group 9 is finally connected to the connection terminal 51a of the respective memory modules, in any memory module, by letting the connection terminal 51a be the connection terminal for transmitting an intrinsic signal to a memory, all signals can be transmitted to all memory modules by superimposing a multiple numbers thereof and attaching them.

Figure 3:
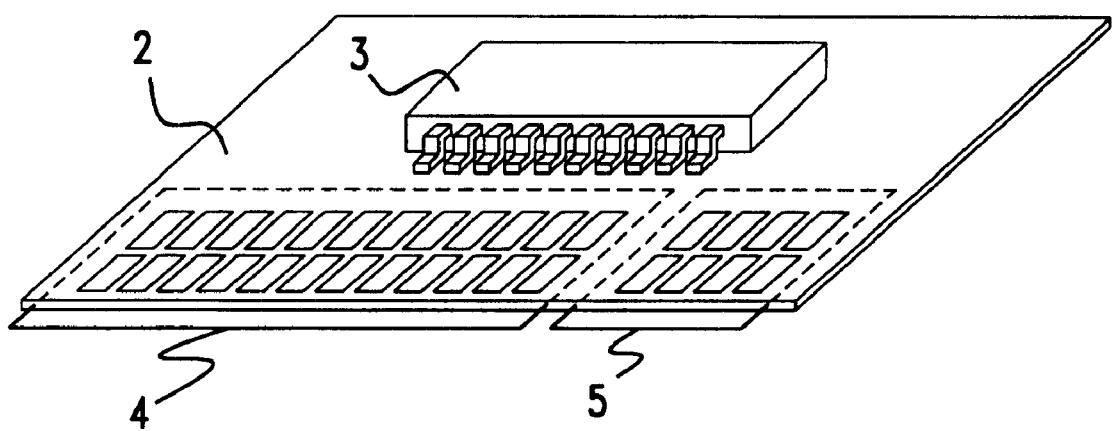
FIG. 3 is a perspective view showing a memory module according to an embodiment of the present invention.
Figure 4:
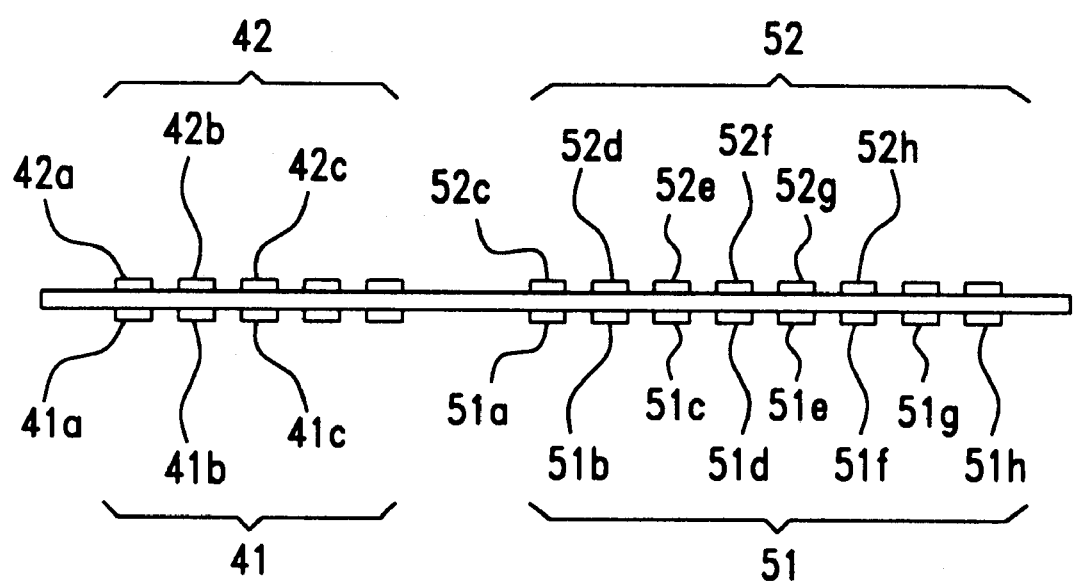
FIG. 4 is a front view showing a memory module according to an embodiment of the present invention.

In the embodiments shown in FIGS. 1 and 2, it is a case of one intrinsic signal for one memory module, but in a case where there are multiple intrinsic signals for one memory module, it can be dealt with by the methods shown in FIGS. 3 or 4. As shown in FIG. 3, by letting the arrangement of the connection terminal groups 4, 5 to be two rows, and letting the other configuration to be the same as the configuration shown in FIG. 1(b), two lines of the intrinsic signals can be connected for each memory module. It is obvious that more intrinsic signals can be connected by further increasing the number of arrangements of terminal groups.

Further, FIG. 4 shows the electrical contact between the connection terminal groups 51 and 52 for transmitting an intrinsic signal. Connection terminals are in electrical contact with terminals that are adjacent to the ones that are adjacent to the connection terminals that oppose one another through the circuit board. That is, the connection terminal 51c is in electrical contact with the connection terminal 52c, and the connection terminal 51d is in electrical contact with the connection terminal 52d. As a result, any memory module can use the connection terminals in two locations of 51a, 51b as the connection terminals for transmitting an intrinsic signal. It is an obvious that more intrinsic signals can be connected by further separating the gap between the connection terminals that electrically contact the connection terminals 51 and 52. Of course, the method shown in FIG. 3 and the method shown in FIG. 4 may be combined.

Figure 5:
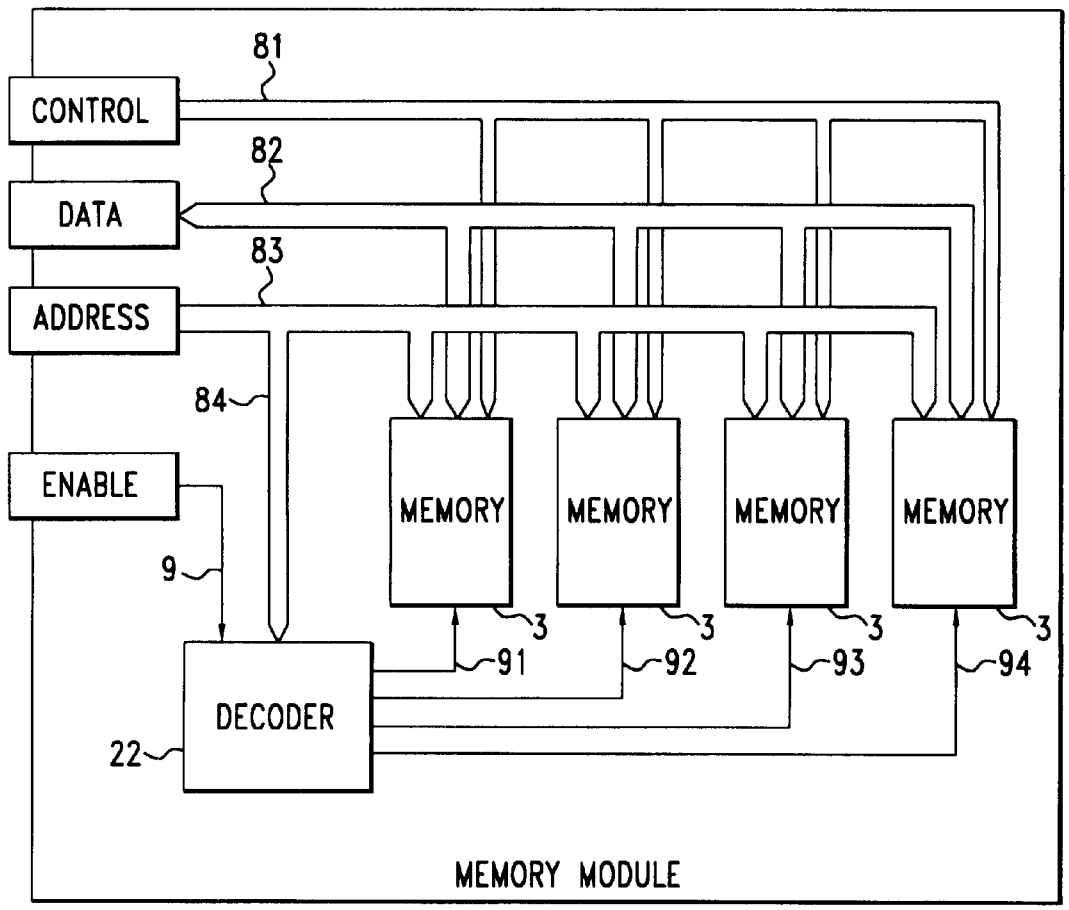
FIG. 5 is a block diagram showing a memory module according to an embodiment of the present invention.

Further, as shown in the block diagram of FIG. 5, in case that a plurality of intrinsic signals are required originally, it is possible to make the connection terminal for transmitting the intrinsic signals with only one terminal by loading the logic circuit 22 such as a decoder to all memory modules, inputting thereto the common signal group 84 and one intrinsic signal 9, and outputting the required number of intrinsic signals 91, 92, 93, 94.

Figure 6:
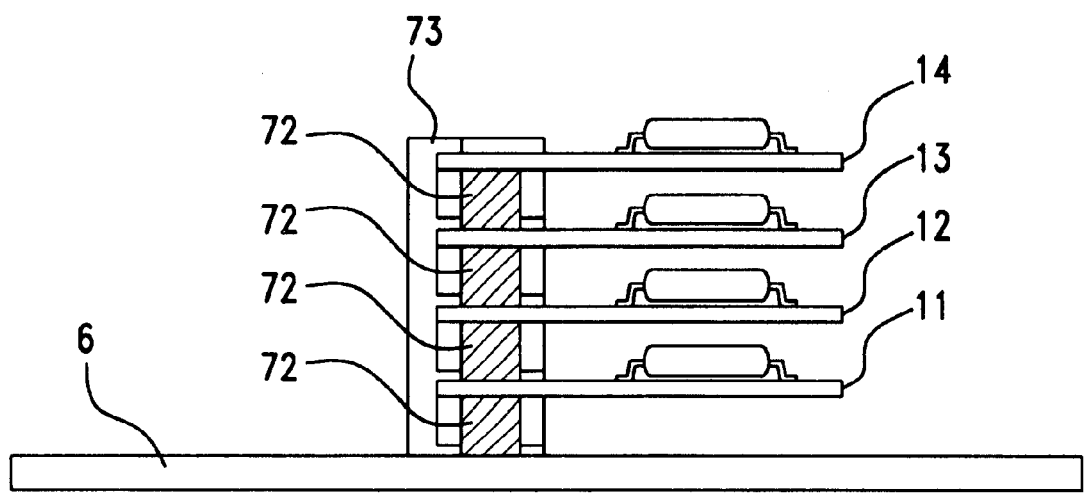
FIG. 6 is a side view showing an attaching method of a memory module according to an embodiment of the present invention.

FIG. 6 illustrates a connection method of a memory module according to an embodiment of the present invention, and is a view of the connection method shown in FIG. 2 shown in a side view, including device body 6 and memory modules 11, 12, 13, and 14. In-between the device body 6 and the respective memory modules, the connection terminals facing one another are electrically contacted by a zebra connector 72. Fixture 73 is provided on the device body 6 for securing the connection of the respective memory modules. The zebra connector 72 is used for the connection between the device body 6 and the respective memory modules. A variety of other connector mechanisms, including, for example, a conducting adhesive could be used. Examples of conductive adhesives which could be used include a gel type anisotropic conduction adhesive (ACP) and/or a sheet type anisotropic conduction sheet (ACF). Moreover, the anisotropic conduction adhesive and/or the anisotropic conduction film may be contained in an anisotropic conduction adhesive member. Further, when connecting the connection terminals facing one other using the anisotropic conduction adhesive, the anisotropic conduction adhesive may be placed between the connection terminals, and the connection terminals may be connected using a facility for crimping and heating.

Figure 7:
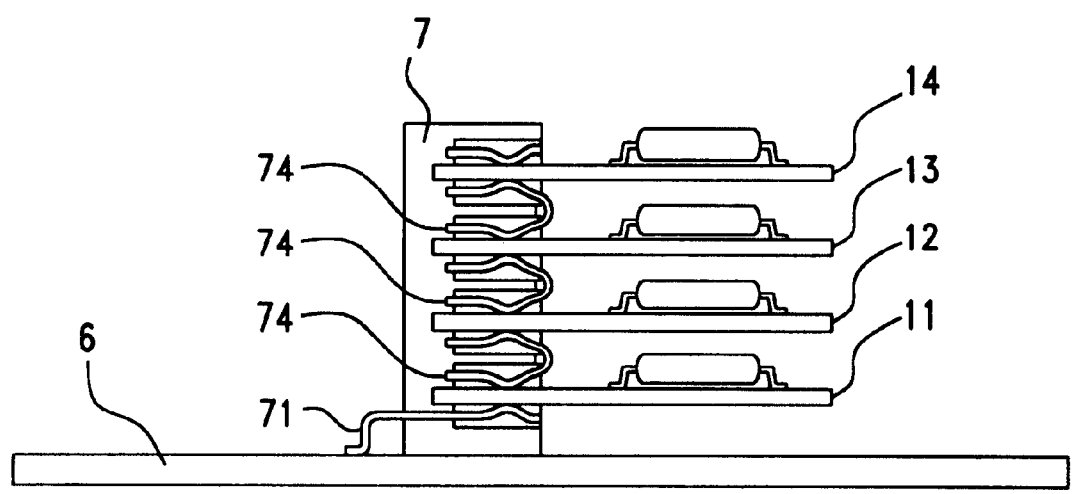
FIG. 7 is a side view showing an attaching method of a memory module according to an embodiment of the present invention.

FIG. 7 illustrates an embodiment in some ways similar to that shown in FIG. 6, where the memory modules 11, 12, 13, and 14 are connected to the device body 6. For the connection between the device body 6 and the respective memory modules, the connector 7 is used, and the connector 7 connects the device body 6 and the first memory module 11 with the connection terminal 71. Further, the connector 7 may be provided with one or more contact point springs 74 for electrically coupling the connection terminals facing one another between the respective memory modules and makes it possible to transmit the necessary signals to all memory modules. The installment area on the device body is little affected even if the number of memory modules to be utilized is arbitrarily increased.

Figure 8A:
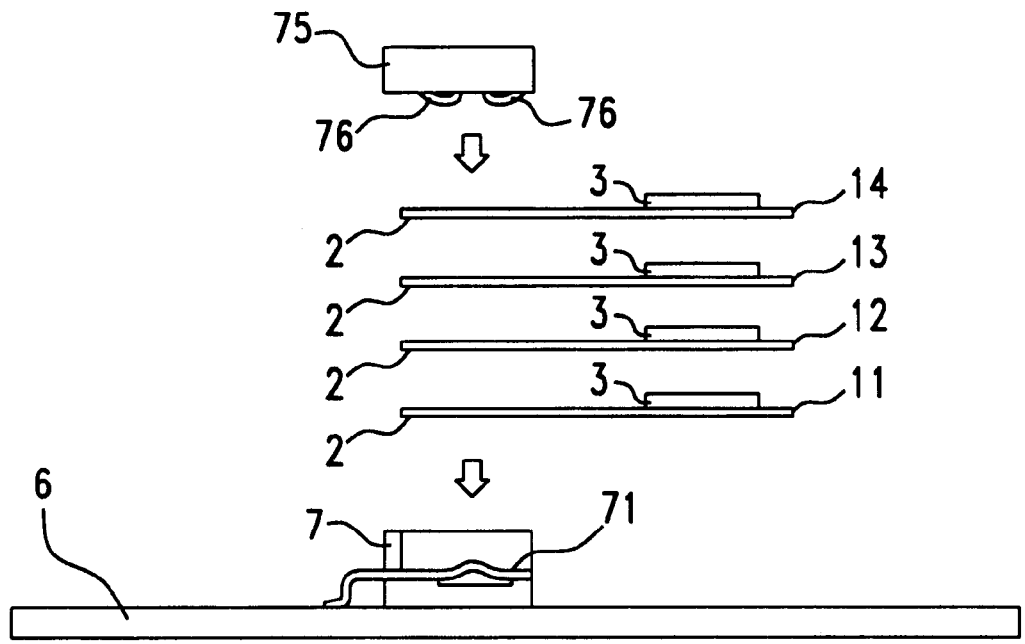
FIG. 8 is a side view showing an attaching method of a memory module according to an embodiment of the present invention.
Figure 8B:
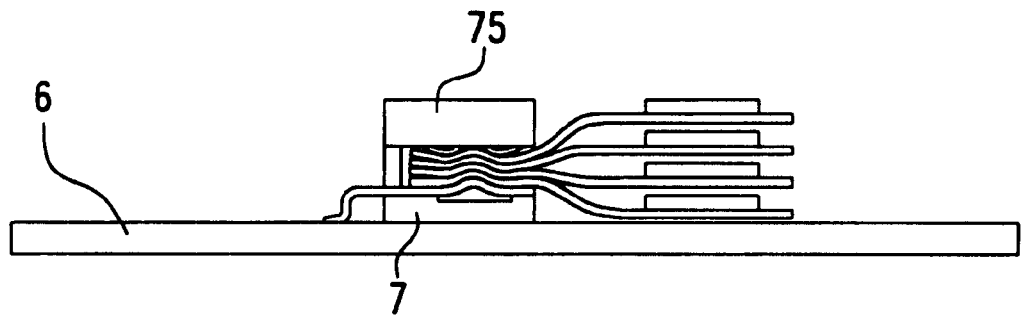

FIGS. 8(a), (b) are diagrams showing an attachment method when a flexible board is used for the circuit board of the memory module according to embodiments of the present invention. FIG. 8(a) shows a view before making an attachment, and FIG. 8(b) shows a view after having made an attachment. The device body 6 comprises the connector 7, and the connector 7 may possess at least one terminal spring 71 for the required number of signals. After having imposed the memory modules with the required number on the connector, they are held down from above with a weight device 75 having a weight spring 76. Electrical connections may be made by sandwiching an anisotropic conduction film between the connection terminals of the respective memory modules. As shown in FIG. 8(b), because of the flexibility of the flexible board, the connection terminal units may be deformed by the terminal spring 71 and the weight spring 76. As a result, the contact points may occur between the respective connection terminals, and thus it is possible to conduct with the respective memory modules as they are.

By placing an anisotropic conduction adhesive between the connection terminals, it is not necessary to provide connector members between the respective memory modules for conduction. As a result, the laminate thickness of the connection terminal units in the respective modules can be made much thinner than when using a connector between each memory module. With no connector member placed between the memory modules, alignment of such connectors is not necessary, and it is possible to achieve a narrower pitch of the connection terminal units.

Figure 9:
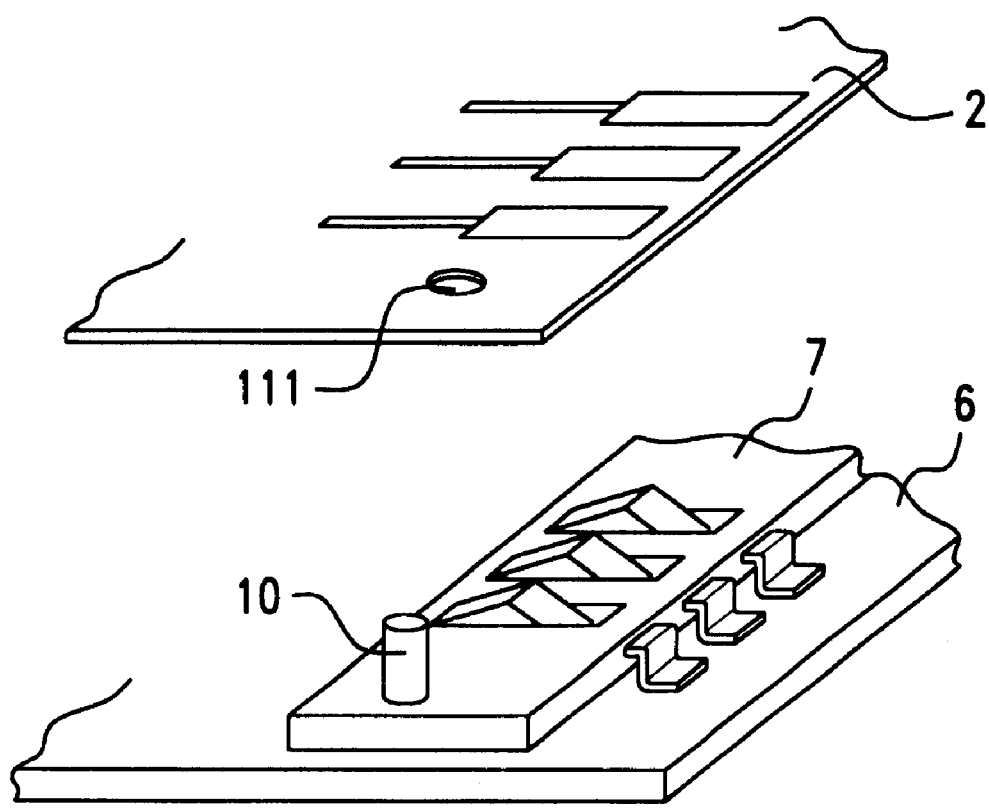
FIG. 9 is an illustrative view showing an installation structure of a connector 7 provided with a protrusion unit and of a memory module according to an embodiment of the present invention.

Sandwiching the memory module with the connector 7 and the weight device 75 may be accomplished using an uneven fitting structure. FIG. 9 is an illustrative diagram showing the installation structure of the connector 7 provided with a protrusion and of a memory module 2. As shown in the figure, a projection 10 is provided at an edge unit of the connector 7, and together with the hole unit provided in the weight device 75, the uneven fitting structure is formed. Then using the uneven fitting structure for the connector 7 and the weight device 75, no shifting occurs on either side of the memory module stack, thereby securely sandwiching the memory module 2. Further, by providing in the memory module 2 a bore 111 that can be fitted with the projection 10, it makes possible to locate the memory module 2 for the connector 7, thereby enabling more secure electrical coupling of the connection terminals.

Figure 10:
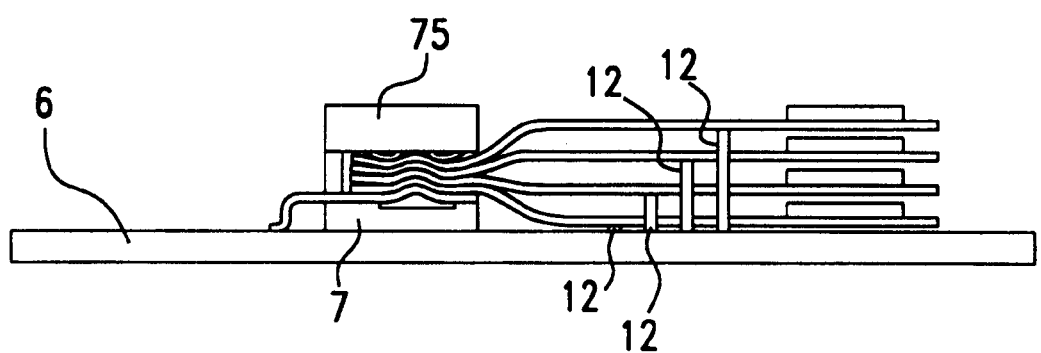
FIG. 10 is an illustrative view showing an installation structure of which only the common parts in the respective memory modules are collected on the connector 7 side according to an embodiment of the present invention.
Figure 11:
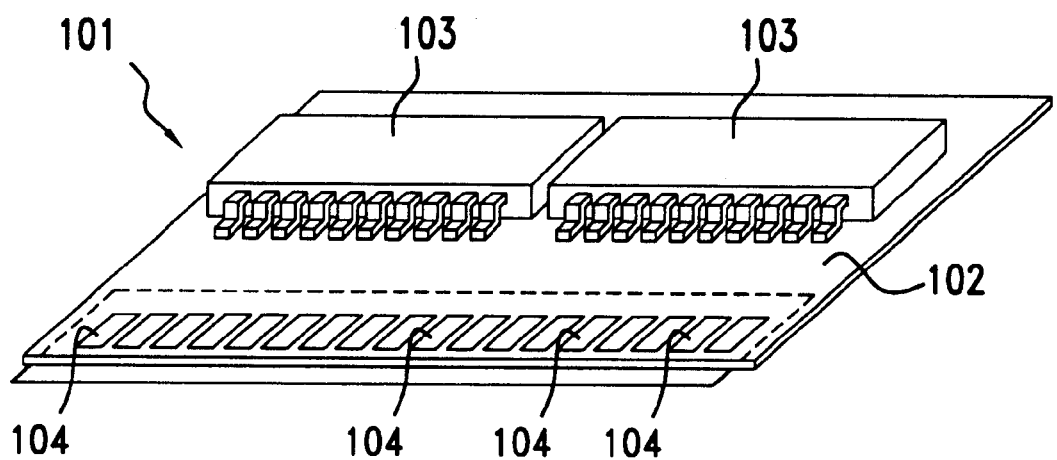
FIG. 11 is a perspective view showing a conventional memory module.
Figure 12:
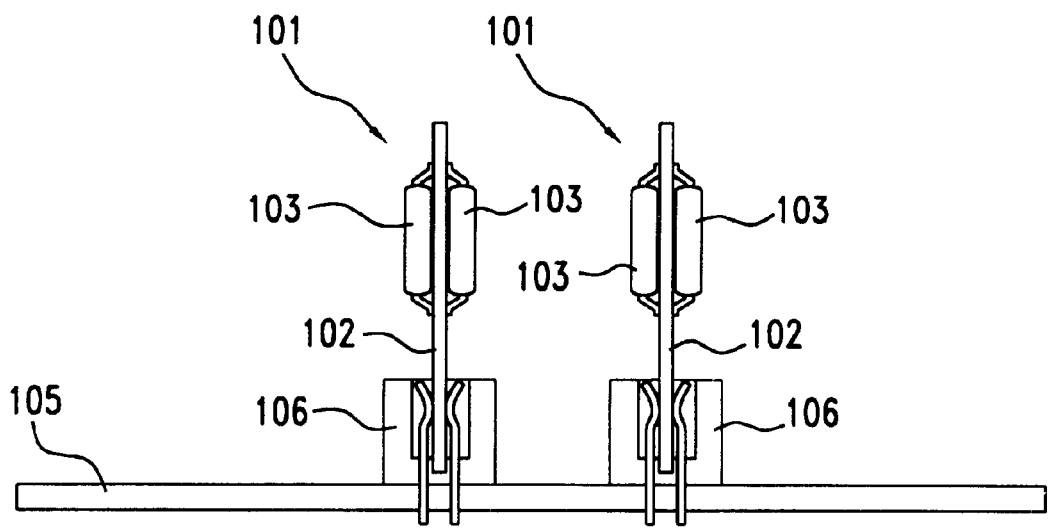
FIG. 12 is a side view showing an attaching method of a conventional memory module.

Further, as shown in FIG. 10, by collecting only the common units in the respective memory modules on the connector 7 side, other and the signals for the respective memory modules may be connected to the device body 6 side using a jumper 12 or a lead. By collectively connecting the common connection terminals to the device body 6 side, it makes it possible to reduce the mounting area.

In addition, in certain embodiments the memory 3 may be made thinner by using pair chips mounting and the like, so that an extremely thin memory module can be obtained. This makes it possible to load more memory modules on a device which has a thickness limitation such as a memory card, and a loading method thereof will be a very simple method. By mounting a memory 3 which is much thinner due to pair chips mounting and the like, a much smaller computer can be made, and loading a large quantity of memory modules can be easily accomplished.

Furthermore, it is not necessary that all of the memories 3 mounted on the memory module are the same kind. For example, different kinds of memory (such as SRAM, DRAM, flash-memory and the like) may be utilized among a multiple of memory modules 1. In the case of different kinds of memory being utilized, it is only necessary to absorb the differences among the accessing methods by loading an ASIC and the like on the respective memory modules.

Memory modules according to certain embodiments of the present invention include a memory module comprising a circuit board on which a memory chip is mounted, and a plurality of connection terminals which are respectively provided at symmetrical locations on both sides of said circuit board for passing a signal with the memory chip through the connection terminals. The memory module is characterized in that the connection terminals have both a first connection terminal group for passing a specific signal in the memory chip, and a second connection terminal group for passing other signals. The connection terminals of the first connection terminal group are such that the connection terminals at asymmetrical locations on both sides of the circuit board are electrically coupled together. The connection terminals of the second connection terminal group are such that the connection terminals at symmetrical locations on both sides of the circuit board are electrically coupled together. As a result, at a time when an allocation of a signal to a connection terminal is attached by piling up a multiple number of the identical memory modules, a necessary signal can be connected to all memory modules in a simple structure, and can be prevented from increasing the mounting area while keeping a general versatility of the memory modules.

A laminated body of memory modules according to certain embodiments of the present invention includes a stack of superimposed memory modules having connection terminals that are electrically coupled with the memory chips on the memory modules and placed at the facing locations on adjacent memory modules are electrically coupled with each other, and as a result, by sending a signal to the connection terminals of the memory modules at the top level or at the bottom level, it makes possible to send the signal to an arbitrary laminated memory module within the stack, thereby enabling a large number of modules to be located in a small mounting area.

Further, according to certain embodiments, a laminated body of memory modules for installing a memory module for passing a signal with a memory chip is made through connection terminals into a device body, and is characterized in that the connection terminals that are facing each other in adjacent, overlapping memory modules for passing a specific signal to the memory chip are connected to each other, as well as the connection terminals that are facing each other in adjacent, overlapping memory modules for passing other signals are connected to each other, and makes these as a common signal line. The common signal line is connected to said device body, and as a result, a selection of the respective memory modules that are laminated, and a transmission/reception of data and the like to the selected memory module can be made from the device body through the common signal line, thereby making it possible to reduce the mounting area for the device body.

Moreover, in certain embodiments a laminated body of memory modules for mounting on a device body is characterized in that the connection terminals for passing a specific signal in a memory chip are individually connected to the device body, and the connection terminals that are facing each other in adjacent memory modules for passing other signals are connected to each other, making a common signal line. The common signal line is connected to the device body, and as a result, without individually connecting the common connection terminal of the respective memory modules to the module mounted side, but connecting to the module mounted side using the common signal line, it is possible to reduce the mounting area.

Embodiments also relate to a memory card and a computer, which include memory modules formed as described in above embodiments, in which miniaturization thereof can be achieved, and multiple memory modules can be attached together as one memory device and then easily incorporated into a memory card and/or a computer.

It will, of course, be understood that modifications of the present invention, in its various aspects, will be apparent to those skilled in the art. Embodiments permit a plurality of memory modules to be stacked together to form a variety of memory devices for use in components requiring memory, such as memory cards, computers and the like. Using structures such as those described herein, space-saving memory devices in which specific memory modules within the device can easily be accessed may be formed. Other embodiments are possible, their specific features depending upon the particular application. Therefore, the scope of the invention should not be limited by the particular embodiments herein described but should be defined by the appended claims and equivalents thereof.

What is claimed:

1. A memory module comprising:
   a circuit board on which a memory chip is mounted;
   a plurality of connection terminals which are provided at locations on both sides of said circuit board for passing a signal with said memory chip through said connection terminals;
   said connection terminals including a first connection terminal group for passing a specific signal in said memory chip, and a second connection terminal group for passing other signals;
   said connection terminals of said first connection terminal group being configured such that connection terminals on both sides of said circuit board that are facing each other through said circuit board are not electrically connected; and
   said connection terminals of said second connection terminal group being configured such that connection terminals on both sides of said circuit board that are facing each other through said circuit board are electrically connected.

2. A memory module according to claim 1, further comprising at least one additional memory module, said memory modules being laminated into a body, said laminated body including superimposed memory modules having connection terminals on adjacent memory modules facing one another; wherein said connection terminals facing one another on adjacent memory modules are electrically connected with each other.

3. A laminated body of memory modules according to claim 2, wherein said laminated body of memory modules is mounted on a device body.

4. A laminated body of memory modules according to claim 3, wherein at least one connector for use in attaching said memory modules is mounted thereon.

5. A laminated body of memory modules according to claim 4, wherein each memory module is mounted on a circuit board, said circuit board comprising a flexible board.

6. A laminated body according to claim 4, wherein said connection terminals are electrically connected together by sandwiching said at least one connector.

7. A laminated body of memory modules according to claim 5, said laminated body memory modules having connection terminals facing one another on adjacent memory modules, said connection terminals facing one another on adjacent memory modules being electrically coupled together by sandwiching said modules together.

8. A laminated body of memory modules according to claim 2, wherein an anisotropic conduction adhesive member is located between said connection terminals facing one another on adjacent memory modules.

9. A laminated body of memory modules according to claim 2, each memory module coupled to a circuit board, further comprising:
   a connector for sandwiching said memory modules;
   at least one first part for use in fitting memory modules together, said first part being provided with said connector; and
   at least one second part for use in fitting each memory module to its circuit board, said second part being provided with said circuit board;
   wherein said connection terminals facing one another on adjacent memory modules are electrically coupled with each other by fitting said first part with said second part.

10. A memory card, comprising a memory module according to claim 1.

11. A computer, comprising a memory module according to claim 1.

12. A memory module as in claim 1, wherein said connection terminals of said first connection terminal group are electrically connected to connection terminals on the other side of the circuit board that are adjacent to said connection terminals that are facing each other through said circuit board.

13. A laminated body of memory modules comprising memory chips and connection terminals for passing one or more signals between a memory chip and a device body,
   said connection terminals including a first group of connection terminals for passing a specific signal to a specific memory chip, said first group of connection terminals facing one another from overlapping memory modules and being electrically connected to each other,
   a second group of connection terminals for passing other signals to said memory chips as common signal lines, said second group of connection terminals facing one another from overlapping memory modules and being electrically connected to each other, and
   said common signal lines being connected to said device body.

14. A laminated body of memory modules comprising memory chips and connection terminals,
   said laminated body being coupled to a device body,
   said connection terminals including first connection terminals for passing a specific signal to a specific memory module chip, said first connection terminals being individually connected to said device body from said specific memory module,
   said connection terminals including second connection terminals that are facing one another from overlapping memory modules in said laminated body, said second connection terminals facing each other being electrically connected to each other as a common signal line, and said common signal line being connected to said device body.

15. A memory device comprising:

a first memory module including:

a circuit board having top and bottom surfaces;

at least one memory chip on at least one of said top and bottom surfaces;

a plurality of top surface connection terminals disposed on said top surface and a plurality of bottom surface connection terminals disposed on said bottom surface;

wherein a first group of said plurality of connection terminals includes first group top surface connection terminals in electrical contact with and located directly above first group bottom surface connection terminals; and a second group of said plurality of connection terminals includes second group top surface connection terminals in electrical contact with second group bottom surface connection terminals that are not directly below said top surface connection terminals.

16. A memory device as in claim 15, wherein said second group of said plurality of connection terminals includes second group top surface connection terminals in electrical contact with and located diagonally above second group bottom surface connection terminals.

17. A memory device as in claim 15, further comprising:

a second memory module having the same connection terminal structure as said first memory module, wherein said second memory module is stacked directly over said first memory module; and said bottom surface connection terminals of said second memory module are electrically connected to the adjacent top surface connection terminals of said first memory module.

18. A memory device as in claim 17, further comprising additional memory modules stacked over said second memory module.

19. A memory device as in claim 15, wherein said circuit board comprises a flexible material.

20. A method for forming a memory device comprising:

providing a plurality of memory modules having top and bottom surfaces and top and bottom connection terminals, each memory module including a first connection terminal group including first top surface connection terminals in electrical contact with and located directly above first bottom surface connection terminals, and a second connection terminal group including second top surface connection terminals in electrical contact with second bottom surface connection terminals that are not directly below said second top surface connection terminals; and stacking at least two of said memory modules so that the top connection terminals from a first memory module are directly aligned with and electrically coupled to the bottom connection terminals of a second memory module.

21. A method as in claim 20, further comprising the step of providing a conducting adhesive between the connection terminals of adjacent memory modules.

22. A method as in claim 20, further comprising providing at least one connector and sandwiching said memory modules within said connector.

23. A memory module comprising:

a circuit board on which a memory chip is mounted on a surface thereof;

a plurality of connection terminals which are provided at locations on opposite sides of the circuit board;

the connection terminals including a first connection terminal group having terminals on opposite sides of a portion of the circuit board and a second connection terminal group having terminals on opposite sides of a portion of the circuit board;

the first connection terminal group including connection terminals on opposite sides of the circuit board that are directly aligned with one another when viewed from a direction perpendicular to the circuit board surface, wherein the connection terminals of the first connection terminal group on opposite sides of the circuit board that are directly aligned with one another are not in electrical contact with each other; and the second connection terminal group including- connection terminals on opposite sides of the circuit board that are directly aligned with one another when viewed from a direction perpendicular to the circuit board surface, wherein the connection terminals of the second connection terminal group on opposite sides of the circuit board that are directly aligned with one another are electrically connected through the circuit board.

24. A memory module as in claim 23, wherein a plurality of the connection terminals of the first connection terminal group-are electrically connected to connection terminals on an opposite side of the circuit board that are adjacent to the directly aligned connection terminals.

* * * * *